United States Patent [19]
Hayes et al.

[11] Patent Number: 5,081,418
[45] Date of Patent: Jan. 14, 1992

[54] METHOD AND APPARATUS FOR TUNING AN NMR FIELD COIL

[75] Inventors: Cecil E. Hayes, Wauwatosa; Matthew G. Eash, Oconomowoc; Scott A. Weiss, Muskego, all of Wis.

[73] Assignee: General Electric Company, Milwaukee, Wis.

[21] Appl. No.: 518,009

[22] Filed: Apr. 30, 1990

[51] Int. Cl.⁵ ............................................. G01R 33/20
[52] U.S. Cl. .................................. 324/322; 324/318
[58] Field of Search ............. 324/322, 318, 313, 314, 324/307; 128/653 SC; 333/221, 231, 235

[56] References Cited

U.S. PATENT DOCUMENTS

| | | | |
|---|---|---|---|
| 4,638,253 | 1/1987 | Jaskolski et al. | 324/318 |
| 4,680,548 | 7/1987 | Edelstein et al. | 324/318 |
| 4,799,016 | 1/1989 | Rezvani | 324/322 |
| 4,820,985 | 4/1989 | Eash | 324/318 |
| 4,820,987 | 4/1989 | Mens | 324/318 |
| 4,833,409 | 5/1989 | Eash | 324/318 |

FOREIGN PATENT DOCUMENTS

0093387 4/1990 Japan ................................. 324/318

Primary Examiner—Hezron E. Williams
Assistant Examiner—Louis M. Arana
Attorney, Agent, or Firm—Quarles & Brady

[57] ABSTRACT

A method of tuning a radio frequency coil for use in MR imaging applications uses reactive shunts having a reactance in parallel with a switch to connect sections of the coil to ground thereby constraining the resonant mode of the coil to a known orientation. A plurality of measurements of the frequency of the resonances along different such constrained orientations is used to deduce the frequencies of the two unconstrained orthogonal resonant modes of the coil and its orientation. The shunts may also be used to tune the coil according to the deduced frequencies of the unconstrained resonance and the desired frequency and orientation by adjusting the reactance of the shunts. A shunt having a variable reactance and a switch for shorting the RF coil as required uses a PIN diode in combination with a variable reactance.

5 Claims, 3 Drawing Sheets

METHOD AND APPARATUS FOR TUNING AN NMR FIELD COIL

BACKGROUND OF THE INVENTION

This invention relates to nuclear magnetic resonance (NMR) imaging methods and systems. More specifically, this invention relates to the tuning of radio frequency (RF) coils used with NMR apparatus to transmit and receive RF signals.

In NMR imaging, a uniform magnetic field $B_0$ is applied to the imaged object along the z axis of a Cartesian coordinate system, the origin of which is centered within the imaged object. The effect of the magnetic field $B_0$ is to align the object's nuclear spins along the z axis. In response to an RF magnetic signal of the proper frequency, oriented within the x-y plane, the nuclei precess about the z-axis at their Larmor frequencies according to the following equation:

$$\omega = \gamma B_0$$

where $\omega$ is the Larmor frequency, and $\gamma$ is the gyromagnetic ratio which is constant and a property of the particular nuclei. Water, because of its relative abundance in biological tissue and the properties of its nuclei, is of principle concern in such imaging. The value of the gyromagnetic ratio $\gamma$ for water is 4.26 khz/gauss and therefore in a 1.5 Tesla polarizing magnetic field $B_0$ the resonant or Larmor frequency of water is approximately 63.9 Mhz.

In a typical imaging sequence, the RF signal centered at the Larmor frequency $\omega$, is applied to the imaged object by means of a radio frequency (RF) coil. A magnetic field gradient $G_z$ is applied at the time of this RF signal so that only the nuclei in a slice through the object along the x-y plane, which have a resonant frequency $\omega$, are excited into resonance.

After the excitation of the nuclei in this slice, magnetic field gradients are applied along the x and y axes. The gradient along the x axis, $G_x$, causes the nuclei to precess at different resonant frequencies depending on their position along the x axis, that is, $G_x$ spatially encodes the precessing nuclei by frequency. Similarly, the y axis gradient, $G_y$, is incremented through a series of values and encodes y position into the rate of change of phase as a function of gradient amplitude, a process typically referred to as phase encoding.

A weak RF signal generated by the precessing nuclei may be sensed by the RF coil and recorded as an NMR signal. From this NMR signal, a slice image may be derived according to well known reconstruction techniques. An overview NMR image reconstruction is contained in the book "Magnetic Resonance Imaging, Principles and Applications" by D. N. Kean and M. A. Smith.

Figure 1:
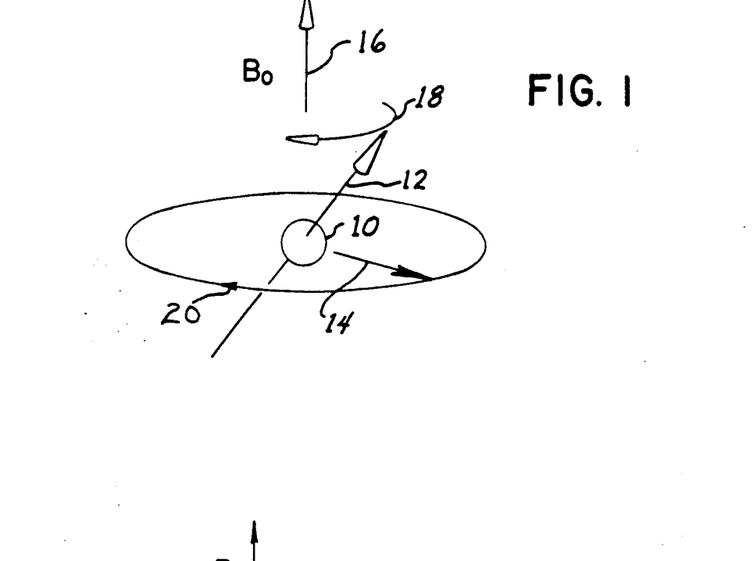
FIG. 1 is a perspective representation of a precessing nuclear spin excited by an RF magnetic field showing the orientation of the static magnetic field $B_0$ and the RF magnetic vector as discussed in the Background of the Invention.

Referring to FIG. 1, a nucleus 10 has a magnetic moment 12 which may be excited into precession 18 about a static magnetic field $B_0$ along axis 16 by an RF magnetic signal producing magnetic field 14 along a plane perpendicular to the static magnetic field $B_0$.

The exciting RF magnetic field 14 may oscillate along a single axis within the x-y plane. Such an oscillating field may be generated by a "saddle" coil (not shown) comprised of two conductive loops disposed along the axis of oscillation and perpendicular to the static magnetic field $B_0$ as is known in the art.

A more effective excitation of the nuclear moments 12 may be achieved with a circularly polarized RF magnetic field 14, i.e. one that produces a rotating magnetic field vector 14. Preferably, the magnetic vector of field 14 rotates within the x-y plane at an angular velocity equal to the Larmor frequency $\omega$ as shown by arrow 20 in FIG. 1.

Figure 2A:
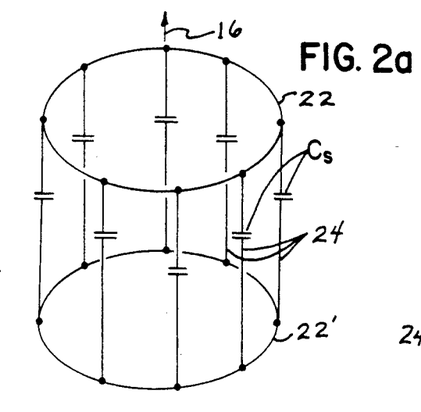
FIG. 2(a) is a schematic representation of a resonant RF coil employing opposing conductive loops and having reactive elements in the low-pass configuration as discussed in the Background of the Invention.

It is known that a rotating RF magnetic field 14 may be generated with certain RF coil structures when the coil structure is excited at its "resonant" frequency. Referring to FIG. 2(a), a coil structure 28 for creating a rotating magnetic field is comprised of a pair of conductive loops 22 and 22' spaced along the axis 16 of the static magnetic field $B_0$. The loops 22 and 22+ are joined with a series of conductive segments 24 parallel to axis 16 of the static magnetic field $B_0$. The loops 22 and 22' and conductive segments 24 have an intrinsic inductance and may be broken along their length with capacitive elements $C_e$ to promote the desired pattern of current flow through the conductive segments 24 when the coil is driven by an external RF generator (not shown). The capacitive elements $C_s$ may be positioned along the conductive segments 24 between the loops 22 and 22' as in FIG. 2(a) in a "low-pass" configuration; along the loops 22 and 22' between the conductive segments 24 as in FIG. 2(b) in a "high-pass" configuration; or in both of the aforementioned positions as in FIG. 2(c) in a "bandpass" configuration.

Figure 2B:
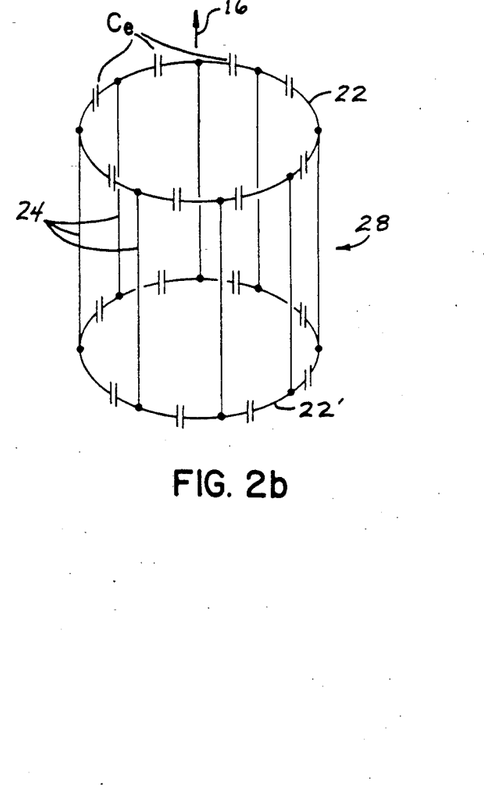
FIG. 2(b) is a schematic representation of a resonant RF coil similar to that of FIG. 2(a) but showing the high-pass configuration.
Figure 2C:
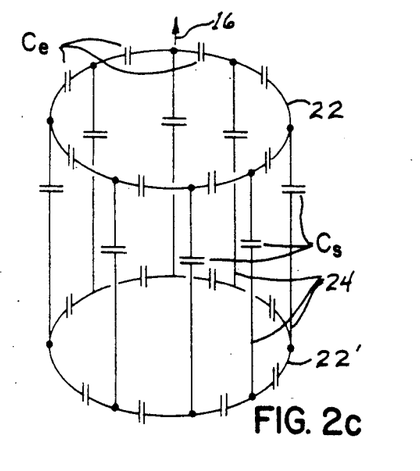
FIG. 2(c) is a schematic representation of a resonant RF coil similar to that of FIG. 2(a) but showing the band-pass configuration.

Detailed descriptions of the above RF coil structures 28 are given in the following U.S. Pat. Nos. assigned to the assignee of the present application and hereby incorporated by reference: 4,680,548, entitled: "Radio Frequency Field Coil for NMR" and issued July, 14, 1987; 4,692,705, entitled: "Radio Frequency Field Coil for NMR" and issued Sept. 8, 1987; and, 4,694,255, entitled: "Radio Frequency Field Coil for NMR" and issued Sept. 15, 1987. These designs will be referred to collectively as "resonant RF coils".

When a resonant RF coil 28 is driven in a first resonant mode at a particular frequency $f_1$, the phase of the current distribution in each axial segment 24 will be proportional to the transverse angle $\theta$ of the segment 24 measured around the axis 16 of the static magnetic field $B_0$. This phase distribution is the result of a "delay line" effect of the distributed inductance of the coil 28 in combination with the capacitive elements $C_e$ and $C_s$ which together create a standing wave of voltage along each loop 22 and 22'. At the driving frequency $f_1$ the delay line produces a full $\theta$ of phase shift in the current flowing though the conductive segments 24, for 360° of angular displacement $\theta$ of the conductive segments 24. As is understood in the art, this current distribution produces an RF a magnetic field 14 having a sinusoidally varying magnitude directed along a first fixed axis at some angle $\theta_1$.

By appropriately driving the coil structure 28 at a second mode with a second signal of frequency $f_2 = f_1$, a second orthogonal standing wave, angularly displaced along the loop 22 and 22' by 90°, may be generated. This second standing wave will create a second magnetic field 14 having a sinusoidally varying magnitude directed along a second fixed axis at some angle $\theta_2$ orthogonal to $\theta_1$. The combined effect of the two modes will be to create a circularly polarized RF magnetic field 14 rotating about the longitudinal axis 16 with an an angular velocity equal to the frequency of the first and second driving signals $f_1$ and $f_2$.

Typically, these two orthogonal modes are generated by exciting the coil structure 28 at two different excitation points displaced from one another by 90° about the longitudinal axis 16. The coil structure 28 may be driven by a RF generator (not shown) directly connected across one of the capacitive elements $C_s$ in an conductive segment 24. Alternatively, U.S. Pat. No. 4,638,253, entitled: "Mutual Inductance NMR RF Coil Matching Device," issued Jan. 20, 1987, teaches a method of inductively coupling an RF source 26 to the coil structure 28. This patent is also assigned to the assignee of the present application and hereby incorporated by reference.

If the values of the capacitances and inductances distributed around the coil structure 28 are not equal, the two orthogonal resonant modes of the coil structure may have different frequencies $f_1$ and $f_2$ oriented at angles $\theta_1$ and $\theta_2$. As a rule, the fields 14 generated by each mode will remain orthogonal regardless of their absolute orientation and their frequencies, and will shift to an angle about the longitudinal axis 16 that permits the greatest difference between $f_1$ and $f_2$ as a result of variations in capacitance and inductance around the coil structure 28. One result of this is that only $\theta_1$ need be measured as $\theta_2$ will always equal $\theta_1 + 90°$.

If the two resonant modes of the coil structure have different frequencies $f_1$ and $f_2$, the uniformity of the RF magnetic field 14 will be degraded and the efficiency of energy transfer between the coil and the NMR apparatus will be decreased.

Small variations in the values of the inductances and capacitances of the coil structure 28 may be "tuned" out by the use of reactive shunts positioned around the circumference of the coil. The shunts may be used to trim the reactive elements of the RF coil and thus adjust $f_1 = f_2$.

Determining the proper value of each shunt necessary to tune the RF coil 28 is accomplished by measuring $f_1$ and $f_2$ of the untuned RF coil 28 by exciting the coil 28 through a range of frequencies with a signal generator and using an inductively coupled network analyzer to plot the strength of the current flow in the coil 28 versus the excitation frequency at various locations about the coil 28. The plot will show two closely spaced peaks corresponding to the resonant modes of frequency $f_1$ and $f_2$. The location on the RF coil 28 with the greatest current flow for one peak, as determined by moving the inductive coupling of the network analyzer to various places on the coil 28, will indicate the location of one of either $\theta_1$ or $\theta_2$ from which the other may be determined.

This tuning method may be difficult and time consuming. Often the peaks at $f_1$ and $f_2$ are not clearly differentiated or obscured by noise. The requirement that the inductive coupling for the signal generator and network analyzer be moved around the coil 28 is complicated by the fact that network analyzer must be isolated by a significant distance from the large magnetic field associated with the NMR system and hence each move requires the operator to walk back and forth a distance between the equipment and the coil.

SUMMARY OF THE INVENTION

The present invention provides a simple means of determining the frequencies $f_1$, $f_2$ and the orientations $\theta_1$ and $\theta_2$ of the two modes of an RF coil. Measurements of the frequency of resonance of the RF coil are made with the coil constrained so that the resonances occur at specific angles $\theta$. These measurements are combined to deduce the frequencies $f_1$ and $f_2$ and orientations $\theta_1$ and $\theta_2$ of the orthogonal resonant modes of the unconstrained RF coil.

In one embodiment, only four measurements of the resonant frequency of the RF coil are made for four modes constrained to have orientations along relative angles of 0°, 45°, 90° and 135°.

Accordingly, it is one object of the invention to provide a rapid method of determining the frequency and orientation of the resonant modes of an untuned RF coil. Such measurements then may be used to tune the RF coil.

The orientations of the resonant modes of the RF coil may be constrained to particular angles, for measurement, by means of shunts attached to the coil at predetermined points and selectively connecting those points to ground. The shunts force a primary resonant mode of the RF coil to lie along an axis determined by the shunt locations and the shunts suppress any secondary orthogonal resonant mode.

It is another object of the invention, therefore, to simplify the measurement of the frequency of a primary resonant mode of the RF coil by suppressing any near-frequency secondary orthogonal mode.

An RF coil for use with this measuring method has a pair of conductive loops disposed in a spaced apart relation along a central axis and a plurality of conductive segments electrically interconnecting the pair of conductive loop elements at periodic points around each of said loop elements. The conductive segments and loops include reactive elements which cause the RF coils to resonate at a given frequency.

A shunt is attached to the RF coil for tuning the resonance of the RF coil to a given frequency by means of impedance elements which couple the conductive loops to a reference voltage potential. A switch is also attached to the RF coil to allow the RF coil to be shorted to the reference voltage. The switch includes a switch element in parallel with each of the impedance elements.

It is thus another object of the invention to provide a simple RF coil structure that both permits the shorting of the RF coil for measurement and the subsequent tuning of the RF coil. The switch element may be closed on one pair of the impedance elements to constrain the resonant mode of the RF coil to a particular angle. When the switch elements are opened, the impedance elements may be adjusted to tune the RF coil to the proper mode.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference must be made therefore to the claims herein for interpreting the scope of the invention.

DETAILED DESCRIPTION OF THE PREFERRED EMBODIMENT Construction of the RF Coil

Figure 3:
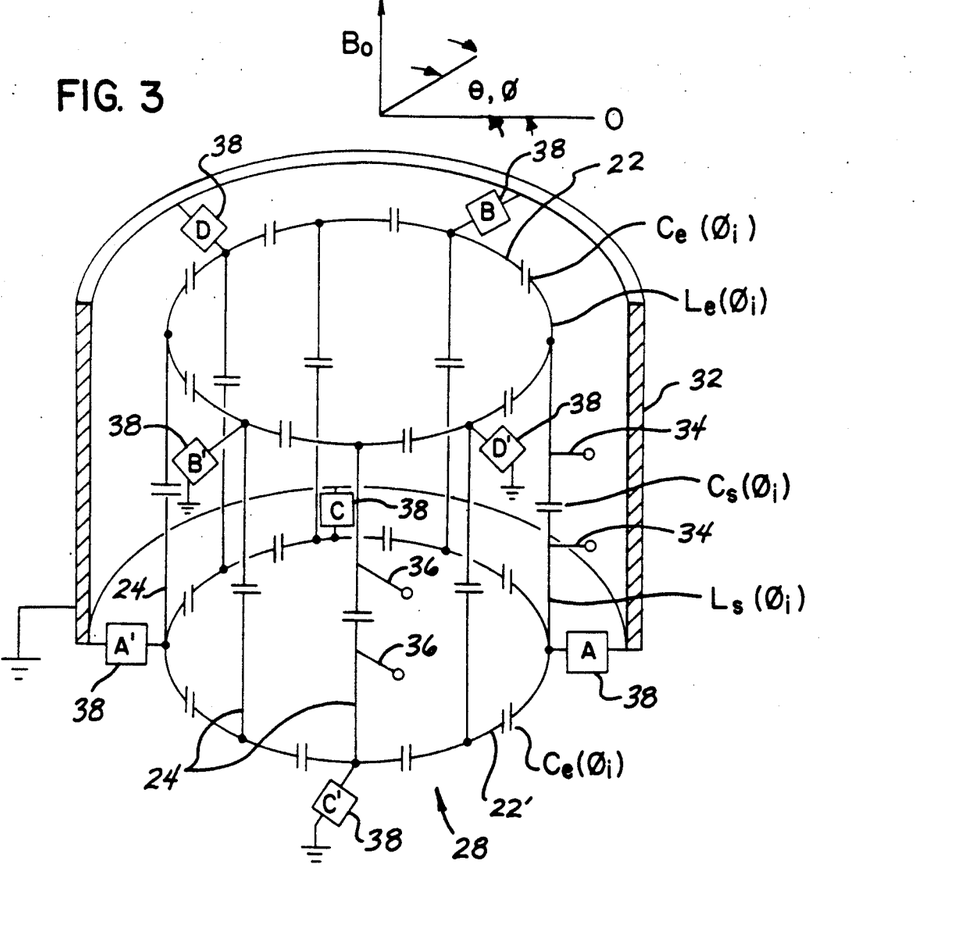
FIG. 3 is a perspective schematic representation of a resonant RF coil constructed according to the present invention showing placement of the shunts.

Referring to FIG. 3, an NMR imaging system coil assembly includes an excitation magnetic RF coil 28 and a shield 32. The shield 32 is a grounded conductive tube that is coaxial with the RF coil 28 and other coils (not shown) used in a conventional NMR imaging system. The shield 32 acts to partially contain the magnetic field from the RF coil 28.

The RF coil 28 has two electrically conductive end loops 22 and 22' spaced apart along the common longitudinal axis 16. These end loops 22 and 22' may be circular or elliptical depending upon the desired shape of the central opening of the coil assembly. The two end loop 22 and 22' are interconnected by eight axial conductive segments 24 forming a coil structure that resembles a cylindrical cage. Although the exemplary RF coil 28 has eight conductive segments 24, the present invention can be utilized with cage type RF coils 28 having a greater or lesser number of conductive segments 24.

Each of the conductive segments 24 is provided with at least one capacitive element $C_s$. The conductive end loops 22 and 22' have eight serially connected capacitive elements $C_e$ in each section of the end loop 22 and 22' between the points of attachment of adjacent conductor segments 24. The connecting lengths of the coil 28 between each of these capacitances $C_s$ and $C_e$ are understood to be inductive and each length may be designated $L_e$ or $L_s$ corresponding to their locations on the end loops 22 and 22' or segments 24. Each of the capacitive elements $C_e$ and $C_s$ and each of the conductive segments 24 may be identified by its angular location $\phi$ measured around the longitudinal axis 16 in the same manner as $\theta$. The origin of angle $\theta$ is arbitrary, however both $\theta$ and $\phi$ share a common origin for the purposes of the following discussion. The particular cage coil 28 illustrated in FIG. 3 is a band-pass design, as referred to earlier, however the present invention may be used with low-pass and high-pass type coils as will be described.

The RF coil 28 is excited by two radio frequency (RF) signals with 90° phase difference. One signal is applied via leads 34 across a first capacitor $C_s$ of a conductor segment 24 at angle $\theta = 0$. The other RF signal is applied via leads 36 and across a second capacitor $C_s$ of a second conductive segment 24 at angle $\theta = 90°$.

Each of the conductive end loops 22 and 22' is coupled to the shield by four shunts pairs ("shunts") 38 designated pairwise as A and A' through D and D'. The first loop 22 has shunts A and A' connected at angles $\theta = 0°$ and $\theta = 180°$ respectively and shunts C and C' connected at angles $\theta = 90°$ and $\theta = 270°$ respectively. The second loop 22' has shunts B and B' connected at angles $\theta = 45°$ and $\theta = 225°$ respectively and shunts D and D' connected at angles $\theta = 135°$ and $\theta = 315°$ respectively. The shunts 38 on the first loop 22 are preferably displaced with respect to the shunts 38 on the second loop by 45°. As shown, the shunts 38 are connected to the loops 22 and 22' at points of juncture between the loops 22 and 22' and conductive segments 24, however it will be understood from the following discussion that other connection points will be acceptable provided they allow the control of the orientation of the resonant modes of the RF coil 28 as will be described below.

Figure 4:
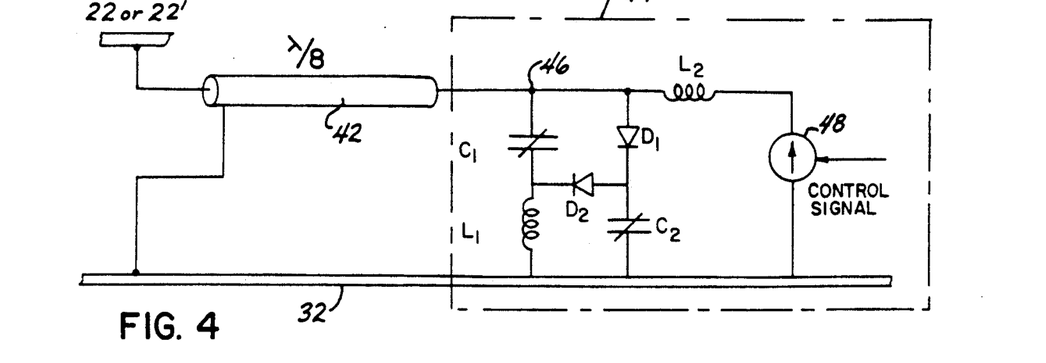
FIG. 4 is a schematic representation of the shunts of FIG. 3.

Referring to FIG. 4 each of the shunts 38 provides a tunable impedance between the RF coil 28 and a common electrical node which is the shield 32 in the preferred embodiment.

The shunts 38 may operate in one of three states: First, a shunt 38 may be tuned to be series resonant at the resonant frequency of the coil 28 acting as an open circuit with no current flowing from the RF coil 28, through the shunt 38, to the shield 32. In this state, the shunt 38 is effectively disconnected.

Second, the shunt 38 may be varied to become additionally capacitive or inductive thus providing a means to tune the coil 28. The general construction of shunts for tuning RF coils is described in U.S. Pat. No. 4,820,985 issued Apr. 11, 1989, assigned to the same assignee as the present invention, and incorporated by reference.

Third, the shunts 38 may provide a low impedance path between the RF coil 28 and the shield 32. The low impedance path will force the mode of the standing wave on the loops 22 and 22' to have zero voltage with respect to the shield 32 and hence a current peak at that point as will be discussed further below. The general construction of shunts for grounding select points on RF coils is described in U.S. Pat. No. 4,833,409 issued May 23, 1989, assigned to the same assignee as the present invention, and incorporated by reference.

As shown in FIG. 4, each shunt 38 comprises a network 44 coupled to the RF coil 28 by a transmission line 42. The "shunt impedance" is the impedance of the shunt 38 as measured from the coil 28 into the transmission line 42. The "network impedance" is the impedance of the network measured after the transmission line 42. The shunt impedance and the network impedance differ as a result of the impedance modifying characteristics of the transmission line 42. The transmission line 42 is of length $\lambda/8$ to reduce signal loss and for reasons of mechanical convenience, but as will be generally understood to those of ordinary skill in the art, other lengths may be used with appropriate modifications of the network 44 impedance.

The network 44 consists of series connected variable capacitor $C_1$ and inductor $L_1$ together connected between a first end 46 of the transmission line 42 and the shield 32. The second end of the transmission line 42 is connected to the RF coil 28 at the appropriate point on loop 22 or 22'.

Capacitor $C_1$ is shunted by series connected PIN diodes $D_1$ and $D_2$. Variable capacitor $C_2$ is connected between the junction of $D_1$ and $D_2$ and the shield 32. A controllable current source 48 is connected through RF choke $L_2$ to the first end of the transmission line 46 to forward or reverse bias diodes $D_1$ or $D_2$.

When diodes $D_1$ and $D_2$ are forward biased by the current source 48, their impedance becomes very low and $C_1$ is effectively bypassed. The network impedance is therefore determined by the parallel combination of $L_1$ and $C_2$. This state is used to tune the RF coil 28 by varying the capacitor $C_2$.

Alternatively, when diodes $D_1$ and $D_2$ are reverse biased by the current source 48, their impedance becomes very high and $C_2$ is effectively isolated from the network 44. The network impedance is therefore determined by the series combination of $C_1$ and $L_1$. $C_1$ may be adjusted so that the network impedance is essentially that of pure capacitance, and the shunt impedance, as transformed by the transmission line 42, is a short circuit to the shield 32.

The construction of tunable shunts is described generally in U.S. Pat. No. 4,833,409 issued May 23, 1989, and U.S. Pat. No. 4,820,985 issued Apr. 11, 1989 both assigned to the same assignee as the present invention, and incorporated by reference.

During normal operation of the NMR imaging system, the PIN diodes $D_1$ and $D_2$ are forward biased, permitting the resonant modes of the coil 28 to be tuned by the capacitor $C_2$ and inductor $L_1$. Prior to the tuning of the RF coil, however, each shunts pair 38 may be activated one pair at a time to create a low impedance path from the coil 28 to ground. The purpose of this activation is to force the resonant mode of the RF coil 28 to have peak currents at the activated shunt locations and thus to aid in measuring the characteristics of the resonant modes of the RF coil 28 as will now be described.

Figure 5:
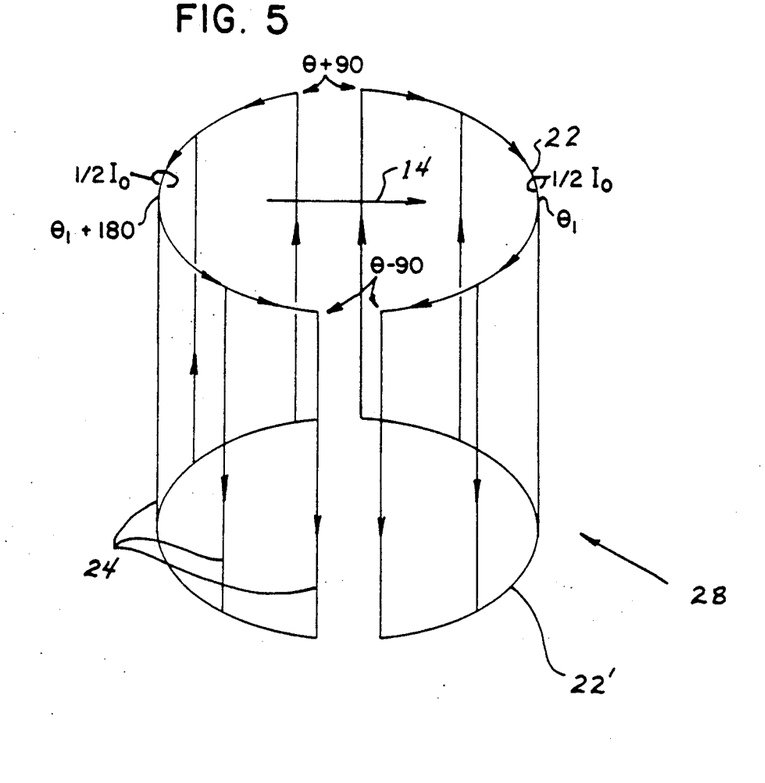
FIG. 5 is a perspective view of current flow in the RF coil of FIG. 3 at resonance for an instant in time and for a primary resonant mode.
Figure 6:
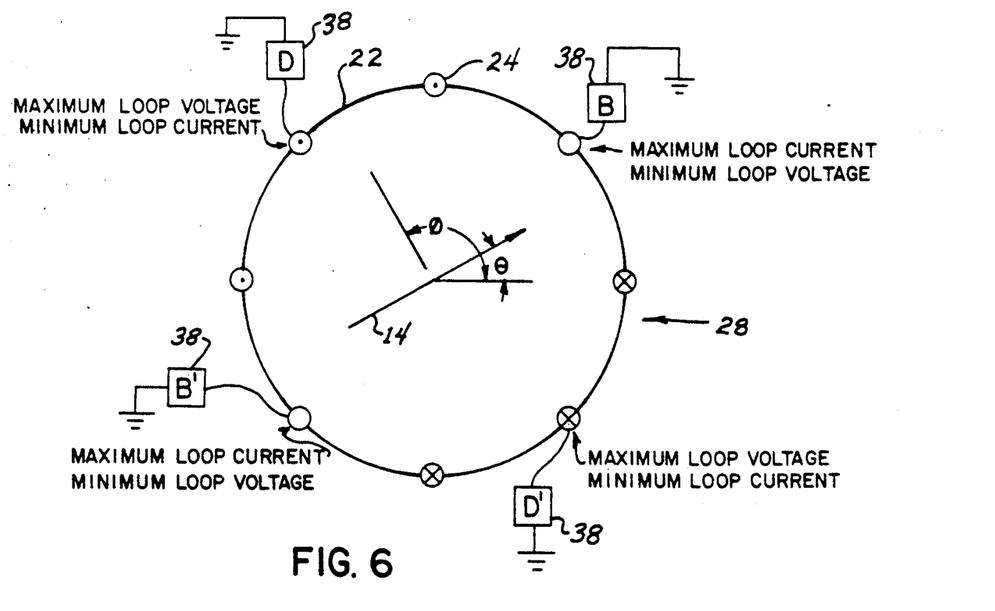
FIG. 6 is a plan view of the current flow in the coil of FIG. 3 showing the points of maximum and minimum voltage and current and the dimensions $\theta$ and $\phi$ for a primary resonant mode.

Referring to FIGS. 5 and 6, the RF coil 28 may support a fundamental resonant mode $m_1$ at a frequency $f_1$ having standing waves of current flow creating an RF magnetic field oscillating along an axis 14 with an orientation at angle $\theta_1$. In this mode, the currents in conductive segments will have values proportional to $\sin(\phi - w\theta_1)$ where $\phi$ is the angle of the conductive segment 24. It is convenient to think of the coil 28 as divided into two halves separated at $\theta = \theta_1 + 90°$ and $\theta = \theta_1 - 90°$ and bisecting any conductor segments 24 at these points along their length. In one half of the RF coil 28 so divided, current flows up the conductor segments 24 in one quarter of the half RF coil 28, across the half loop 22, down the conducting segments 24 in the remaining quarter of the half RF coil 28 and back across the half loop 22'.

The current flowing in this loop around the half of RF coil 28 corresponds to one loop of a solenoid creating the magnetic field 14. The other half of RF coil 28 produces a second loop of current in the same direction corresponding to the second loop of the solenoid. As shown in FIG. 5, no current flows in the conductor segment 24 at the center of the half coil at $\phi = \theta_1 + 0°$ and $\phi = \theta_1 + 180°$, however it will be understood that this point of zero current flow need not line up with a particular segment 24.

As mentioned, variations in the capacitances and inductances around the RF coil 28 may cause the orientation of the magnetic field to occur at an arbitrary $\theta_1$. In any case, however, the coil may be divided into the two half coils as described above. The sum of the currents along the loops 22 and 22' at the centers of the half coils, i.e. $\theta = \theta_1 + 0°$ and $\theta_1 + 180°$ will be defined as the total peak current $I_0$.

As previously discussed and shown in FIG. 3, opposed shunt pairs 38 are positioned around the loop 22 and 22' so as to provide at least one shunt pair 38 at every 45°. By configuring one such shunt pair 38 to be a short circuit to the shield 32, the orientation $\theta'_1$ of the mode $m'_1$ may be controlled to align with a line passing through the shunts 38 that are so activated. This alignment of the mode may be understood intuitively by noting that the shunts 38, by forming a path to ground, create a boundary condition of zero voltage at their connection points to the loops 22 and 22' and thereby force the standing wave around loops 22 and 22' to have voltage nodes at the shunt 38 attachment points. Accordingly, for any two shunts B and B' at $\phi_1$ and $\phi_2 = \phi_1 + 180°$, the mode $m_1$ will be orientated along an axis at angle $\theta'_1$ passing though points on the RF coil 28 at angles $\phi_1$ and $\phi_2$.

When the shunts 38 are activated as so described, the second mode $m_2$, always at $\theta_2 = \theta_1 + 90°$, will be suppressed by the shorting action of the activated shunts facilitating measurement of the frequency of the mode $m_1$ without interference from mode $m_2$.

Determination of the Proper Tuning

The general condition for resonance of the RF coil is that the peak energy stored in the capacitive elements $C_e$ and $C_s$ equals the peak energy stored in the inductive elements $L_e$ and $L_s$ at that frequency. If the total equivalent inductance of the conductive segments 24 is defined as $L_{eq}(\theta)$ and the total equivalent capacitance of the capacitive elements $C_s$ and $C_e$ is defined as $C_{eq}(\theta)$ then the energy E stored in each, respectively, is $$E_L = \frac{1}{2} I_0^2 L_{eq}(\theta) \tag{1}$$

$$E_C = \frac{Q^2}{2C_{eq}(\theta)} \tag{2}$$

where the peak electrical charge stored on the capacitors is $$Q = \frac{I_0}{\omega(\theta)}$$

and $\omega(\theta)$ is the resonant frequency of the coil 28 at a given orientation of the resonant mode and therefore:

$$E_C = \frac{I_0^2}{2\omega(\theta)^2 C_{eq}(\theta)} \tag{2'}$$

Setting $E_C = E_L$ as required for resonance;

$$\frac{1}{2} L_{eq}(\theta) I_0^2 = \frac{I_0^2}{2\omega^2(\theta) C_{eq}(\theta)} \tag{3}$$

The effective capacitance $C_{eq}(\theta)$ and effective inductance $L_{eq}(\theta)$ are functions of the orientation $\theta$ of the mode because the contribution to the total capacitive energy $E_C$ and the total inductive energy $E_L$ will depend on the contribution of energy storage of individual capacitances $C_s(\phi_i)$ and $C_e(\phi_i)$ and individual inductances $L_e(\phi_i)$ and $L_s(\phi_i)$ which in turn will be proportional to the square of the currents flowing through each. And the currents through each such element will depend on the orientation of the standing wave and hence the $\theta$ of the mode. For a similar reason $\omega$, the frequency of the resonant mode in radians will also depend on $\theta$.

The effective capacitance $C_{eq}$, for the purpose of the energy calculation is the energy contributed by each capacitance $C_s(\phi_i)$ and $C_e(\phi_i)$ which is proportional to the square of the current flowing though each capacitance or:

$$\frac{1}{C_{eq}(\theta)} = \sum_{j=1}^{N_s}\left(\frac{1}{C_e'(\phi_j)} + \frac{1}{C_e(\phi_j)}\right)\cos^2(\phi_j - \theta) + \sum_{k=1}^{N_s}\left(\frac{\sin^2(\phi_k - \theta)}{C_s(\phi_k)}\right) \quad (4)$$

where $N_s$ is the number of segments 24 of the coil 28 and $C_e$ and $C_e'$ are the corresponding capacitive elements on the loops 22 and 22' respectively.

The currents through each capacitive elements are sinusoidally related to the position $\phi$ of the element as a result of the conditions for the standing wave on loops 22 and 22' as described above, and $\phi$ is measured from the same origin as the angle $\theta$ of the mode.

As a practical matter, the construction of the the coil 28 results in very uniform inductances $L_e(\phi_i)$ and $L_e(\phi_i)$ and hence $L_{eq}$ will be now be considered a constant independent of $\theta$.

Combining equations (3) and (4) and solving for the resonant frequency yields:

$$f^2(\theta) = \frac{1}{(2\pi)^2 L_{eq}}\left\{\sum_{j=1}^{N_s}\left(\frac{1}{C_e'(\phi_j)} + \frac{1}{C_e(\phi_j)}\right)\cos^2(\phi_j - \theta) + \sum_{k=1}^{N_s}\frac{\sin^2(\phi_k - \theta)}{C_s(\phi_k)}\right\} \quad (5)$$

where $$f(\theta) = \frac{\omega(\theta)}{2\pi}$$

according to a generally recognized convention.

The $\theta$ and $\phi$ dependencies may be separated by trigonometric identities yielding $$f^2(\theta) = \frac{1}{(2\pi)^2 L_{eq}}\left\{F_o + F_c\frac{\cos 2\theta}{2} + F_s\frac{\sin 2\theta}{2}\right\} \quad (6)$$

where:

$$F_0 = \sum_{j=1}^{N_s}\frac{1}{2}\left(\frac{1}{C_e'(\phi_j)} + \frac{1}{C_e(\phi_j)}\right) + \sum_{k=1}^{N_s}\frac{1}{2C_s(\phi_k)} \quad (7)$$

$$F_c = \sum_{j=1}^{N_s}\left(\frac{1}{C_e'(\phi_j)} + \frac{1}{C_e(\phi_j)}\right)\cos 2\phi_j - \sum_{k=1}^{N_s}\frac{\cos 2\phi_k}{2C_s(\phi_k)} \quad (8)$$

and $$F_s = \sum_{j=1}^{N_s}\left(\frac{1}{C_e'(\phi_j)} + \frac{1}{C_e(\phi_j)}\right)\sin 2\phi_j - \sum_{k=1}^{N_s}\frac{\sin 2\phi_k}{2C_s(\phi_k)} \quad (9)$$

Equation (6) gives the resonant frequency $f(\theta)$ for a given $\theta$ orientation of the resonant mode as may be caused by the shorting of particular shunt pairs described above.

For an RF coil 28 that is unconstrained by shorted shunt pairs 38 and having two orthogonal modes $m_1$ and $m_2$ at angles $\theta_1$ and $\theta_2$ and frequencies $f_1$ and $f_2$, $\theta_1$ will be at angle $\theta$ such that $f_1$ and $f_2$ are at maximum and minimum resonant frequencies as determined by equation (6). This fact permits the determination of $f_1$ and $f_2$ by differentiating equation (6) with respect to $\theta$. The points of zero slope of equation (6), where the derivative is equal to zero, will be $f_1$ and $f_2$.

Setting the derivative of equation (6) equal to zero yields:

$$\frac{\sin 2\theta}{\cos 2\theta} = \frac{F_s}{F_c} = \tan 2\theta = \tan(2\theta - \pi) \quad (10)$$

Hence, the angle of the two modes $m_1$ and $m_2$ is:

$$\theta_1 = \frac{1}{2}\tan^{-1}\frac{F_s}{F_c} \quad (11)$$

and $$\theta_2 = \theta_1 + \frac{\pi}{2} \quad (12)$$

Alternatively $$\sin 2\theta_1 = \frac{F_s}{\sqrt{F_s^2 + F_c^2}} = -\sin 2\theta_2 \quad (13)$$

and $$\cos 2\theta_1 = \frac{F_c}{\sqrt{F_s^2 + F_c^2}} = -\cos 2\theta_2 \quad (14)$$

These terms of equations (13) and (14) may be substituted into equation (6) to determine the resonant frequencies $f_1$ and $f_2$ for the two modes $m_1$ and $m_2$ for the unconstrained RF coil 28:

$$f_1^2(\theta_1) = \frac{1}{(2\pi)^2 L_{eq}}\left\{F_o + \frac{\sqrt{F_s^2 + F_c^2}}{2}\right\} \quad (15)$$

$$f_2^2(\theta_2) = \frac{1}{(2\pi)^2 L_{eq}}\left\{F_o - \frac{\sqrt{F_s^2 + F_c^2}}{2}\right\} \quad (16)$$

The frequencies $f_1$ and $f_2$ and orientation $\theta_1$ (or $\theta_2$) are the values needed to properly tune the coil by using the shunts 38 in their reactive modes. Equation (15) and (16) from which these values are obtained, however, require knowledge of the values of capacitances $C_e(\phi_i)$ and $C_s(\phi_i)$ incorporated in terms $F_s$, $F_c$ and $F_o$. Capacitances $C_e(\phi_i)$ and $C_s(\phi_i)$ are generally difficult to determine by direct measurement.

The terms $F_2$, $F_c$ and $F_o$ may be eliminated by making multiple measurements of $f(\theta)$ at various angles $\theta$ as constrained by the shunts 38. Specifically, four measurements of resonant frequencies designated as $f_1$, $f_b$, $f_c$, and $f_d$ and corresponding to the modes at $\theta = 0°, 45°, 90°$ and $135°$ are taken. These modes are created by shorting the appropriate shunt pairs 38 as has been described above.

Substituting the values of $\theta$ for each of these modes into equation (6) and combining the equations so generated gives the following equations providing values of the capacitance dependant terms $F_o$, $F_c$, and $F_s$ in terms of the measurable values of $f_a$, $f_b$, $f_c$, and $f_d$:

$$\frac{f_a^2 + f_b^2 + f_c^2 + f_d^2}{4} = \frac{1}{(2\pi)^2 L_{eq}} F_o \qquad (17)$$

$$f_a^2 - f_c^2 = \frac{1}{(2\pi)^2 L_{eq}} F_c \qquad (18)$$

$$f_b^2 - f_d^2 = \frac{1}{(2\pi)^2 L_{eq}} F_s \qquad (19)$$

The values of $F_s$, $F_c$ and $F_o$ may be solved for and used to eliminate these values in equations in equations (11) and (12) and (15) and (16). With these substitutions $f_1$, $f_2$, and $\theta_1$ is given by the following equations:

$$f_1^2(\theta_1) = \frac{f_a^2 + f_b^2 + f_c^2 + f_d^2}{4} + \frac{\sqrt{(f_a^2 - f_c^2)^2 + (f_b^2 - f_d^2)^2}}{2} \qquad (20)$$

$$f_2^2(\theta_2) = \frac{f_a^2 + f_b^2 + f_c^2 + f_d^2}{4} - \frac{\sqrt{(f_a^2 - f_c^2)^2 + (f_b^2 - f_d^2)^2}}{2} \qquad (21)$$

$$\tan 2\theta_1 = \frac{f_b^2 - f_d^2}{f_a^2 - f_c^2} \qquad (22)$$

With regard to Equation (22), care must be taken to place the angle $\theta_1$ in the proper quadrant by observing the sign of the numerator and denominator.

In this manner, the frequencies $f_1$ and $f_2$ of the resonant modes $m_1$ and $m_2$ and the orientation $\theta_1$ and $\theta_2$ of those modes in the unconstrained RF coil 28 may be determined by using the shunts 38 to take only four frequency measurements. The four frequency measurements are taken on the constrained RF coil 28 shorting particular pairs of the shunts 38 as described. The shunts 38 simplify the making of the frequency measurements by eliminating trial and error and limiting the number of measurements required to four. As mentioned, the shunts 38 also suppress the second resonant mode when they are shorted to ground making measurement of the resonant frequency easier.

Once the frequencies $f_1$ and $f_2$ and orientation $\theta_1$ of the unconstrained resonant modes $m_1$ and $m_2$ of the coil 28 are determined, the shunts 38 are used in their reactive mode to tune the RF coil 28 according to the following formulae:

$$\Delta z(\phi = 0°) = -\frac{\Delta f_1 + \Delta f_2}{2k_b} + \frac{\Delta f_1 - \Delta f_2}{k_b} \cos 2\theta_1 \qquad (23)$$

$$\Delta z(\phi = 45°) = -\frac{\Delta f_1 + \Delta f_2}{2k_b} + \frac{\Delta f_1 - \Delta f_2}{k_b} \sin 2\theta_1 \qquad (24)$$

$$\Delta z(\phi = 90°) = -\frac{\Delta f_1 + \Delta f_2}{2k_b} - \frac{\Delta f_1 - \Delta f_2}{k_b} \cos 2\theta_1 \qquad (25)$$

$$\Delta z(\phi = 135°) = -\frac{\Delta f_1 + \Delta f_2}{2k_b} - \frac{\Delta f_1 - \Delta f_2}{k_b} \sin 2\theta_1 \qquad (26)$$

where $\Delta z(\phi)$ is the required change in impedance of the shunts 38 at positions $\phi$ and $\phi + 180°$, and $\Delta f_1$ and $\Delta f_2$ are the desired shifts in $f_1$, $f_2$ required to make $f_1 = f_2$. $k_b$ is an impedance sensitivity constant that relates change in impedance of the shunt 38 in ohms to change in resonant frequency of the RF coil 28, and is determined by experiment for a class of RF coils 28.

The above description has been that of a preferred embodiment of the present invention. It will occur to those who practice the art that many modifications may be made without departing from the spirit and scope of the invention. For example, the same methods described herein are equally applicable to the low-pass and high-pass types of resonant RF coils. The frequencies and orientations of the modes of such coils may be calculated with the same equations by setting capacitors $C_e$ or $C_s$ to infinity as appropriate. The shunts may be also located at other points on the RF coil 28 provided the resonant modes may be constrained as described. Alternatively, the resonant modes of the coil may be constrained by opening the conducting elements 22, 22' or 24 with switches. The open sections of the conductive elements operate to force the current minimums of the resonant modes to be centered on the open portion thereby constraining the coil 28 without shorting sections to ground. It is well known that the resonant coils may be operated in higher or lower frequency modes where the currents in the conductive segments vary according to $N\theta$ where N is an integer greater than one. The techniques described herein will also work for such higher order resonances as will be understood to those of ordinary skill in the art from the above description. In order to apprise the public of the various embodiments that may fall within the scope of the invention, the following claims are made.

I claim:

1. A method of determining the frequencies $f_1$ and $f_2$ and orientations $\theta_1$ and $\theta_2$ of orthogonal resonant modes of an unconstrained resonant NMR RF coil comprising the steps of:
   a) constraining the orientation of a resonant mode of the RF coil to a given $\theta$;
   b) measuring the frequency of the constrained resonant mode;
   c) repeating steps (a) and (b) to obtain a plurality of different frequency measurements associated with different orientations $\theta$;
   d) deriving the frequencies $f_1$ and $f_2$ and orientations $\theta_1$ and $\theta_2$ of the orthogonal resonant modes of the unconstrained RF coil from the plurality of different frequencies measurements.

2. The method of claim 1 wherein the plurality of different frequency measurements comprise four frequency measurements $f_a$, $f_b$, $f_c$, and $f_d$ where $f_a$ is constrained to an arbitrarily chosen orientation of 0° and where $f_b$, $f_c$, and $f_d$ are taken at orientations displaced successively by 45° from that of $f_a$ and where the frequencies $f_1$ and $f_2$ and orientations $\theta_1$ and $\theta_2$ are calculated from the following equations:

$$f_1^2(\theta_1) = \frac{f_a^2 + f_b^2 + f_c^2 + f_d^2}{4} + \frac{\sqrt{(f_a^2 - f_c^2)^2 + (f_b^2 - f_d^2)^2}}{2}$$

$$f_2^2(\theta_2) = \frac{f_a^2 + f_b^2 + f_c^2 + f_d^2}{4} - \frac{\sqrt{(f_a^2 - f_c^2)^2 + (f_b^2 - f_d^2)^2}}{2}$$

$$\tan 2\theta_1 = \frac{f_b^2 - f_d^2}{f_a^2 - f_c^2}$$

$$\theta_2 = \theta_1 + 90°.$$

3. The method of claim 1 wherein the orientation of the resonant mode in the RF coil is constrained to a given $\theta$ by the use of shunts attached to the coil at predetermined points for connecting those points to ground.

4. The method of claim 1 wherein the orientation of the resonant mode in the RF coil is constrained to a given $\theta$ by the use of switches attached to the coil at predetermined points opening the coil at those points.

5. A method of tuning an unconstrained NMR resonant RF coil to a desired resonant mode, the coil having variable reactance shunt pairs at angles 0°, 45°, 90° and 135° each shunt with variable impedances $z(\phi=0°)$, $z(\phi=45°)$, $z(\phi=90°)$, and $z(\phi=180°)$ respectively, and having an impedance sensitivity of $k_b$ and having untuned orthogonal resonant modes with frequencies $f_1$ and $f_2$ respectively and orientation $\theta_1$ comprising the steps of:

determining a difference in frequency $\Delta f_1$ and $\Delta f_2$ between the desired resonant frequency and $f_1$ and $f_2$ respectively;

calculating the changes of impedances of the shunts required to tune the RF coil according to the following equations:

$$\Delta z(\phi = 0°) = -\frac{\Delta f_1 + \Delta f_2}{2k_b} + \frac{\Delta f_1 - \Delta f_2}{k_b} \cos 2\theta_1$$

$$\Delta z(\phi = 45°) = -\frac{\Delta f_1 + \Delta f_2}{2k_b} + \frac{\Delta f_1 - \Delta f_2}{k_b} \sin 2\theta_1$$

$$\Delta z(\phi = 90°) = -\frac{\Delta f_1 + \Delta f_2}{2k_b} - \frac{\Delta f_1 - \Delta f_2}{k_b} \cos 2\theta_1$$

$$\Delta z(\phi = 135°) = -\frac{\Delta f_1 + \Delta f_2}{2k_b} - \frac{\Delta f_1 - \Delta f_2}{k_b} \sin 2\theta_1.$$

* * * * *

UNITED STATES PATENT AND TRADEMARK OFFICE
CERTIFICATE OF CORRECTION

PATENT NO. : 5,081,418

DATED : January 14, 1992

INVENTOR(S) : Hayes et al.

It is certified that error appears in the above-identified patent and that said Letters Patent is hereby corrected as shown below:

| | |
|---|---|
| Col. 2, line 14 | "loops 22 and 22+" should be -- loops 22 and 22' -- |
| Col. 2, line 50 | "$\Theta$" should be -- 360° --. |
| Col. 6, line 1 | "22 and 22°" should be -- 22 and 22' --. |
| Col. 7, line 43 | "$(\phi-W\Theta_1)$" should be -- $(\phi-\Theta_1)$ --. |
| Col. 11, line 4 | "$f_1$," should be -- $f_a$ --. |

Signed and Sealed this

Twentieth Day of April, 1993

*Attest:*

MICHAEL K. KIRK

*Attesting Officer*     *Acting Commissioner of Patents and Trademarks*